United States Patent [19]

Prass et al.

[11] Patent Number: 4,988,606
[45] Date of Patent: Jan. 29, 1991

[54] NEGATIVE-WORKING RADIATION-SENSITIVE MIXTURE WITH POLYMER HAVING 1,2,3-THIADIAZOLE GROUPS, AND RECORDING MATERIAL PRODUCED THEREFROM

[75] Inventors: Werner Prass; Rudolf Zertani; Juergen Lingnau; Norbert Hanold, all of Mainz, Fed. Rep. of Germany

[73] Assignee: Hoechst Aktiengesellschaft, Frankfurt am Main, Fed. Rep. of Germany

[21] Appl. No.: 420,527

[22] Filed: Oct. 12, 1989

[30] Foreign Application Priority Data

Oct. 14, 1988 [DE] Fed. Rep. of Germany ....... 3835039
Dec. 5, 1988 [DE] Fed. Rep. of Germany ....... 3840910

[51] Int. Cl.$^5$ .............................................. G03F 7/038
[52] U.S. Cl. .................... 430/270; 430/280; 430/287; 526/257; 525/57; 525/142; 525/139; 525/204; 522/109; 522/126; 522/133; 522/113
[58] Field of Search ............ 526/257; 525/57, 142, 525/139, 204; 522/109, 126, 133, 113; 430/270, 280, 287

[56] References Cited

U.S. PATENT DOCUMENTS

| | | | |
|---|---|---|---|
| 3,457,073 | 7/1969 | Delzenne | 430/270 |
| 3,539,559 | 11/1970 | Ruckert | 260/240 |
| 3,558,609 | 1/1971 | Ruckert | 260/240 |
| 4,387,151 | 6/1983 | Bosse et al. | 430/175 |
| 4,631,245 | 12/1986 | Pawlowski | 430/175 |
| 4,933,259 | 6/1990 | Chihara et al. | 430/281 X |

FOREIGN PATENT DOCUMENTS

81/8106 10/1982 South Africa .

Primary Examiner—Cynthia Hamilton
Attorney, Agent, or Firm—Foley & Lardner, Schwartz, Jeffery, Schwaab, Mack, Blumenthal & Evans

[57] ABSTRACT

A negative-working radiation-sensitive mixture comprising a binder and a polymer containing 1,2,3-thiadiazole groups is disclosed. The binder is a polyfunctional compound having functional groups that react with ketene. The polymer is a compound obtained by polymerization of a compound of the general formula I

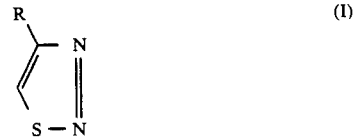

in which R is a polymerizable group. If the polymer is a copolymer containing comonomers having functional groups capable of reacting with ketene, the binder can be omitted. The negative-working radiation-sensitive mixture is particularly suitable for UV, electron beam and X-ray lithography.

8 Claims, No Drawings

NEGATIVE-WORKING RADIATION-SENSITIVE MIXTURE WITH POLYMER HAVING 1,2,3-THIADIAZOLE GROUPS, AND RECORDING MATERIAL PRODUCED THEREFROM

BACKGROUND OF THE INVENTION

The present invention relates to a negative-working, radiation-sensitive mixture containing a binder and a polymer having 1, 2, 3-thiadiazole groups.

Negative-working, radiation-sensitive mixtures have been extensively described in the literature. Despite various embodiments, the solubility of each of these radiation-sensitive mixtures in a suitable developer is diminished by a photochemically initiated reaction.

The abovementioned principle also occurs in a recording material containing unsaturated, polymerizable compounds in combination with a photoinitiator. The recording material is exposed image-wise by means of light or radiation in the absorption region of the photoinitiator and the polymerization reaction which results is, if desired, accelerated by increasing the temperature.

The unexposed, i.e., unpolymerized areas of the recording material, are then removed by means of a suitable developer. EP-A 0,053,708 is representative of such a system.

In a different variation, the photoreaction leads to the formation of crosslinkable intermediates which are then crosslinked with suitable functional groups of other components present in the radiation-sensitive mixture, e.g., a binder. Radiation-sensitive mixtures of this type contain, for example, at least bifunctional azides as the radiation-sensitive component. Some of the many possible examples are described in DE-A 1,572,067, 1,572,068, 1,572,069 and 1,572,070.

There are also systems whose hydrophilicity changes upon exposure to light radiation. Classed with these systems are mixtures containing diazonium salts in combination with suitable binders. The exposure to light cleaves off nitrogen, which drastically reduces the alkali solubility of the radiation-sensitive mixture in the image-wise exposed areas as a result of subsequent reactions. These systems are described in EP-A 0,152,819 and 0,048,876.

While the first-mentioned photopolymerizable systems offer advantages with respect to sensitivity, since a reinforcing effect occurs through the radical-induced chain mechanism, the two last-mentioned systems offer advantages in the resolution and quality of the structures which are reproduced.

Specifically, for producing structures by means of high-energy ionizing radiation (e.g., electron and X-rays), negative-working, light-sensitive mixtures based on polyacrylates and polychloromethylstyrenes are used. In these systems, a reinforcing effect is also present, although they are crosslinking systems, since the quantum yield in these cases for the crosslinking reactions is considerably greater than one.

However, the negative-working, radiation-sensitive systems described are all very limited with respect to the radiation to be selected. Thus, not only the radiation-sensitive mixtures containing components having azide groups but also those containing compounds having diazonium groups have absorption maxima in the near UV region (~365 nm), since the functional groups described are bound directly to aromatic systems. However, radiation-sensitive mixtures of this type require a binder as an additional component. On the other hand, polyacrylates and polychloromethylstyrenes only have low sensitivity in the UV(II) region. They are therefore extremely limited in their application range in this region.

SUMMARY OF THE INVENTION

Accordingly, it is an object of the present invention to provide a radiation-sensitive mixture suitable not only for lithography in the UV region, but also for X-ray and electron beam lithography.

These and other objects according to the invention are achieved by a negative-working radiation-sensitive mixture comprising a binder and a polymer, wherein the binder is a polyfunctional compound having functional groups that react with ketene and wherein the polymer is a compound obtained by polymerization of a compound of the general formula I

in which R is a polymerizable group. Compounds in which R is vinyl, 2-propenyl or butadienyl are particularly preferred.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The compounds of the general formula I can be present as homopolymers. However, copolymers with other customary compounds containing unsaturated groups are also possible. These include styrenes, acrylic acids, methacrylic acids and derivatives thereof, in particular 2-hydroxyethyl methacrylate, maleic acid, itaconic acid and derivatives and esters thereof, vinyl phenols, vinyl acetates, vinyl alcohols and vinyl acetals. In particular, those comonomers containing free hydroxyl groups are preferred for polymerization with the compounds of the general formula I.

However, it is also possible to use those copolymers as binders, which additionally contain monomers not having any of the functional groups described that react with ketene. In particular, the ratio of these components to those containing groups which react with ketenes, if there are two components, is about 0.1:1 to 1:1. However, the appropriate ratio for the particular combination also depends on the number of those functional groups which react with ketene and on the number of the various comonomers in the copolymer.

If, in the case of a copolymer containing monomers of the general formula I, the comonomer carries free hydroxyl groups, the binder containing groups that react with ketene can be omitted. If such a copolymer is present, the ratio of compounds of the general formula I to comonomers is about 0.1:1 to 1:0.1, in particular about 1:1. In this case, the amount of copolymer is about 46% by weight, while the amount of the compounds having functional groups capable of reacting with ketene is about 54% by weight, relative to the solids content of the mixture.

If the comonomer does not contain any free hydroxyl groups, the amount of the copolymer containing units of these comonomers is about 50% by weight, relative to the solids content of the radiation-sensitive mixture.

In this case, the amount of compounds having functional groups capable of reacting with ketene is about 10 to 40% by weight, in particular about 25% by weight, relative to the solids content of the radiation-sensitive mixture.

Compounds that react with ketene can contain one or more of —OH, —SH, —NHR, —NH$_2$, —NR$_2$, —COCl, —COOH, —CONH$_2$, —CONHR, —CSNH$_2$, —CSNHR, —NHNH$_2$, —CONHNH$_2$, —NH—N=CR$_2$, —N=C=O, t,70 and —CHO as functional groups.

Compounds containing —OH, —SH, —COCl,

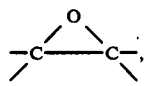

and NH$_2$ as functional groups are particularly preferred, and compounds having —OH groups and the binders from EP 0,152,819 are especially preferred. The functional groups mentioned can be present either in the main chain or in the side chain.

Examples of compounds containing the functional groups mentioned are phenolic resins of the novolak type, such as, for example, phenol/formaldehyde resins, cresol/formaldehyde resins, their mixed condensation products and their mixtures, and phenol and cresol condensation products with other aldehydes. Further examples are glycidyl (meth)acrylates, polyvinyl phenols, polyvinyl alcohols, hydroxyalkyl methacrylates, i.e., synthetic compounds formed by polycondensation or polyaddition.

Natural polymers, such as, for example, cellulose, starch, dextrins and the like and their esters and ethers, provided they still carry free hydroxyl groups, are also used. Derivatives of cellulose and starch are, for example, hydroxyethylated or hydroxypropylated compounds.

In addition to the fact that the compound described above must have the functional groups as such, in order to be used as a component in the radiation-sensitive mixture according to the invention, it also has to be compatible with the remaining components in the mixture.

1, 2, 3-Thiadiazoles are known from the literature as photochemical crosslinking agents. US-A 3,457,073 describes their use in lithographic recording materials. In contrast to the polymers formed by polymerization of the compounds of the general formula I, the compounds described in this reference contain 1, 2, 3-thiadiazole groups bound to a polymer via carboxylate groups, i.e., the thiadiazole groups are incorporated in the macromolecule via a polymer-analogous reaction However, this process has the disadvantage that complete reactions of the corresponding functional groups are hardly feasible and the starting substances which are not bound chemically cannot be separated off completely. The material described in US-A 3,457,073 is therefore very difficult to obtain in reproducible form.

On the other hand, polymers formed by polymerization of 4- or 5-alkenylthiadiazoles are known. M. Pieper and H. Meier describe their photoreaction in *Liebios Ann. Chem.* 1986, 1353–1359. Upon exposure to light, photochemical elimination of nitrogen from 1, 2, 3-thiadiazoles with the formation of 1, 3-diradicals(1), which can be stabilized in various ways, takes place. Of particular interest are those subsequent reactions which lead to dimerizations, i.e., a reaction type which explains the photochemically induced crosslinking reactions.

Radicals and products formed photochemically:

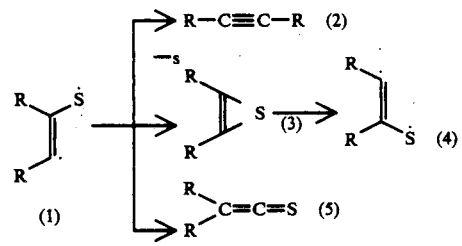

Dimerization products, the basis for crosslinking:

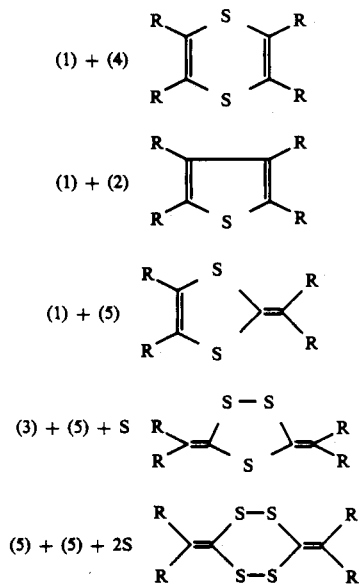

In other words, in principle these systems can be used for differentiation in lithographic layers. However, it was found that the sensitivities achievable are even worse than in systems described in US-A 3,457,073. It was therefore particularly surprising that, by use of this type of 1, 2, 3-thiadiazoles and compounds containing functional groups capable of reacting with ketene, an improved image differentiation could be achieved.

If desired, colorants, pigments, plasticizers, wetting agents and flow-improving agents as well as polyglycols, cellulose ethers, e.g., ethylcellulose, can be added to the radiation-sensitive mixture according to the invention to improve specific requirements such as flexibility, adhesion and gloss.

Preferably, the radiation-sensitive mixture according to the invention is dissolved in solvents such as ethylene glycol, glycol ethers (e.g., glycol monomethyl ether, glycol dimethyl ether, glycol monoethyl ether or propylene glycol monoalkyl ethers, in particular propylene glycol methyl ether), aliphatic esters (e.g., ethyl acetate, hydroxyethyl acetate, alkoxyethyl acetate, n-butyl acetate, propylene glycol monoalkyl ether acetate, in particular propylene glycol methyl ether acetate or amyl acetate), ethers (e.g., dioxane), ketones (e.g., methyl ethyl ketone, methyl isobutyl ketone, cyclopentanone and cyclohexanone), dimethylformamide, dimethylacetamide, hexamethylphosphoric amide, N-methylpyrrolidone, butyrolactone, tetrahydrofuran and in mixtures thereof. Glycol ethers, aliphatic esters and ketones are particularly preferred.

The solutions formed by means of the components of the radiation-sensitive mixtures usually have a solids content of about 5 to 60% by weight, preferably up to about 50% by weight.

Furthermore, according to the invention, a radiation-sensitive recording material is provided which consists essentially of a substrate and the radiation-sensitive mixture applied thereto.

Suitable substrates are all materials of which capacitors, semiconductors, multi-layer printed circuits or integrated circuits can consist or from which they can be manufactured. Particularly suitable are surfaces consisting of pure, thermally oxidized and/or aluminum-coated silicon which may be doped or undoped, as well as all other supports and substrates customary in semiconductor technology, such as silicon nitride, gallium arsenide and indium phosphide. Further suitable substrates are those known from liquid crystal display manufacture, such as glass or indium/tin oxide. Metal plates and sheets (for example, made of aluminum, copper, zinc), bimetal and trimetal sheets, as well as electrically non-conducting sheets metallized by vapor deposition, for example, aluminum-coated $SiO_2$ materials and paper, are also suitable. These substrates can be subjected to a pretreatment by heating, roughened on the surface, etched or treated with chemicals to improve desirable properties, e.g., hydrophilicity.

In a particular embodiment, the radiation-sensitive mixture can contain, in the resist or between the resist and the support or substrate, an adhesion promoter for better adhesion. In the case of silicon or silicon dioxide substrates, suitable adhesion promoters are of the aminosilane type, e.g., 3-aminopropyltriethoxysilane or hexamethyldisilazane.

The recording material according to the invention is subjected to image-wise irradiation by means of high-energy radiation sources; electron or X-rays are preferred. If sufficiently transparent binders are used, image-wise irradiation by means of short-wave UV radiation (deep UV) is also possible.

The layer thickness varies depending on the particular use. It is about 0.1 to 1000, in particular about 1 to 10, μm.

The radiation-sensitive mixture can be applied to the substrate by spraying, flow-coating, rolling, spin-coating and dip-coating. The solvent is then removed by evaporation so that the radiation-sensitive layer remains on the surface of the substrate. The removal of the solvent can, if necessary, be promoted by heating the layer to temperatures of up to about 150° C. However, it is also possible to apply the mixture in the abovementioned manner first to an intermediate substrate from which it is transferred to the final substrate under pressure and elevated temperature. The intermediate substrates that can be used are in principle all materials mentioned above as suitable substrates, as long as they are flexible.

After application to the intended substrate, the layer is subjected to image-wise radiation. Preferably, high-energy radiation such as X-ray or electronic radiation is used; high energy synchrotron radiation having dosage values of about 0 to 200 $mJ/cm^2$ or the radiation of an electron beam writer is particularly preferred. The actual differentiation reaction (crosslinking) can in individual cases take place at room temperature. However, as a rule, additional heating (post-exposure bake) lasting from about 1 to 30 minutes, and preferably taking place at temperatures of about 90° to 150° C., is favorable. In the radiation-sensitive layer, an image pattern is then exposed by development by treating the layer with a developer solution which dissolves or removes the non-exposed areas of the material.

The developers used are solutions of alkaline reagents such as silicates, metasilicates, hydroxides, hydrogen or dihydrogen phosphates, carbonates or bicarbonates, in particular, of alkali metal or ammonium ions, but also of ammonia or organic ammonium bases and the like. The proportion of these substances in the developer solution is, in general, about 0.1 to 15% by weight, preferably about 0.5 to 5% by weight, relative to the weight of the developer solution.

The preparation of the copolymers contained in the radiation-sensitive mixture according to the invention will be illustrated by means of the examples which follow.

EXAMPLE 1

(a) Copolymerization of 4- vinyl-1, 2, 3-thiadiazole with 2-hydroxyethyl methacrylate.

2.00 g (17.8 mmol) of 4-vinyl-1, 2, 3thiadiazole and 2.32 g (17.8 mmol) of 2-hydroxyethyl methacrylate are dissolved together with 59 mg of azobisisobutyronitrile in 20 ml of dried tetrahydrofuran. A dry nitrogen stream is passed through the solution at 20° C. for one hour. The mixture is heated to 65° C. and refluxed for 6 hours. After the reaction is completed, the polymer obtained is precipitated with 400 ml of hexane, filtered with suction and dried at room temperature in vacuo. This gives 0.6 g of a slightly yellow, glass-like solid soluble in dimethylformamide, N-methylpyrrolidone and THF.

The determination of the molecular weight by gel permeation chromatography gives an $M_w$ of 8000 and an $M_n$ of 3300 (polystyrene calibration). Elemental analysis (50.6% C, 6.4% H, 10.0% N and 11.6% S) shows a copolymer composition of one part of 4-vinyl-1, 2, 3-thiadiazole to 1.4 parts of 2-hydroxyethyl methacrylate.

(b) Structuring of the copolymer by means of electron beams.

A silicon wafer (not oxidized) is cleaned by means of ethanol and coated with a 3% solution of the copolymer described in (a) in tetrahydrofuran by means of a spin coater (5 seconds at 1000 revolutions per minute). A layer thickness of 0.4 μm is obtained.

A striped pattern is written into the layer by means of a scanning electron microscope containing a pattern generator at various energy doses in the range from 5 to 200 $\mu C/cm^2$. The patterns are developed by immersion into tetrahydrofuran for 10 seconds. The result is that even at a dosage of 20 $\mu C/m^2$ the structures are completely resistant to the developer and have good edge sharpness (better than 0.1 μm).

EXAMPLE 2 (COMPARATIVE EXAMPLE)

(a) Polymerization of 4-vinyl-1, 2, 3-thiadiazole-5-carboxylic acid.

The procedure of the process is as in Example 1a).

(b) Structuring of poly(4-vinyl-1, 2, 3- thiadizole)-5-carboxylic acid.

A silicon wafer (not oxidized) is cleaned analogously to Example 1b) and coated with a 0.4 μm thick layer of poly(4-vinyl-1, 2, 3-thiadiazole)-5- carboxylic acid.

A striped pattern is written into the layer by means of a scanning electron microscope containing a pattern generator at various energy doses in the range from 10 to 350 μC/cm². The patterns are developed by immersion into tetrahydrofuran for 30 seconds. Only at and above a dosage of 150 μC/cm² do parts of the structures not dissolve in the developer; however, the differentiation of the patterns is insufficient. A longer development time (>1 minute) ultimately dissolves the irradiation layer completely, so that no image whatsoever is obtained.

EXAMPLE 3

Structuring of poly(4-vinyl-1, 2, 3-thiadiazole) in a mixture with a copolymer consisting of methyl methacrylate and glycidyl methacrylate (1:1).

A silicon wafer (not oxidized) is cleaned analogously to Example 1b) and coated with a 0.4 μm thick layer consisting of 50% by weight of poly(4-vinyl-1, 2, 3-thiadiazole) and 50% by weight of the copolymer consisting of methyl methacrylate and glycidyl methacrylate (1:1).

A striped pattern is written into the layer by means of a scanning electron microscope containing a pattern generator and various energy doses in the range from 5 to 200 μC cm². The patterns are developed by immersion into acetone for 60 seconds. Only at and above a dosage of 5 μC cm² is it possible to obtain a completely and well-resolved structure having a high edge sharpness.

EXAMPLE 4

Structuring of poly(4-vinyl-1, 2, 3-thiadiazole) in a mixture with an m-cresol/formaldehyde novolak.

A silicon wafer (not oxidized) is cleaned analogously to Example 1b) and coated with a 0.4 μm thick layer consisting of 50% by weight of poly(4-vinyl-1, 2, 3-thiadiazole) and 50% by weight of an m-cresol/formaldehyde novolak of a softening range of 105° to 120° C.

A striped pattern was written into the layer by means of a scanning electron microscope containing a pattern generator at various energy doses in the range from 5 to 200 μC/cm². The patterns are developed by immersion into acetone for 60 seconds. At a dosage of as low as 10 μC/cm², a completely and well-resolved structure having a high edge sharpness is obtained.

What is claimed is:

1. A negative-working radiation-sensitive mixture comprising a binder and a polymer containing 1, 2, 3-thiadiazole groups, wherein the binder is a polyfunctional compound having functional groups that react with ketene and the polymer comprises a compound obtained by polymerization of a compound of the general formula I

in which R is a polymerizable group.

2. A radiation-sensitive mixture as claimed in claim 1, wherein R is selected from the group consisting of vinyl, 2-propenyl and butadienyl.

3. A radiation-sensitive mixture as claimed in claim 1, wherein the compound that reacts with ketene is a polyfunctional alcohol.

4. A radiation-sensitive mixture as claimed in claim 1, wherein the polymer is a copolymer.

5. A radiation-sensitive mixture as claimed in claim 4, wherein the copolymer comprises a comonomer containing functional groups capable of reacting with ketene.

6. A negative-working radiation-sensitive mixture comprising a polymer containing 1, 2, 3-thiadiazole groups, wherein the polymer is obtained by polymerization of a compound of the general formula I

in which R is a polymerizable group, with a comonomer, and contains functional groups capable of reacting with ketenes.

7. A radiation-sensitive mixture as claimed in claim 6, wherein the comonomer is a monomer containing alcoholic hydroxyl groups.

8. A negative-working radiation-sensitive recording material consisting essentially of a substrate and a radiation-sensitive mixture as claimed in claim 1.

* * * * *

UNITED STATES PATENT AND TRADEMARK OFFICE
CERTIFICATE OF CORRECTION

PATENT NO. : 4,988,606

DATED : January 29, 1991

INVENTOR(S) : Werner PRASS et al.

It is certified that error appears in the above-identified patent and that said Letters Patent is hereby corrected as shown below:

Title Page item [75] should include the following inventor:
Herbert MEIER, Zornheim, Fed. Rep. of Germany Signed and Sealed this Fifth Day of October, 1993

Attest:

BRUCE LEHMAN

Attesting Officer

Commissioner of Patents and Trademarks